US006255887B1

(12) United States Patent
Adams et al.

(10) Patent No.: US 6,255,887 B1
(45) Date of Patent: Jul. 3, 2001

(54) VARIABLE TRANSCONDUCTANCE CURRENT MIRROR CIRCUIT

(75) Inventors: Reed W. Adams, Plano; David J. Baldwin, Allen, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/634,450

(22) Filed: Aug. 8, 2000

Related U.S. Application Data

(60) Provisional application No. 60/148,852, filed on Aug. 12, 1999.

(51) Int. Cl.[7] .......... H03K 5/08

(52) U.S. Cl. .......... 327/326; 327/324; 327/543; 323/315

(58) Field of Search .......... 323/315; 327/108, 327/103, 309, 326, 327, 328, 324, 43, 53; 330/288

(56) References Cited

U.S. PATENT DOCUMENTS 4,709,216 * 11/1987 Davis .......... 330/282
5,512,857 * 4/1996 Koskowich .......... 330/252
5,835,994 * 11/1998 Adams .......... 323/315
5,986,411 * 11/1999 Sueri et al. .......... 327/108
6,198,343 * 3/2001 Matsuoka .......... 327/543

* cited by examiner

*Primary Examiner*—Toan Tran
(74) *Attorney, Agent, or Firm*—Dwight N. Holmbo; Wade James Brady, III; Frederick J. Telecky, Jr.

(57) ABSTRACT

A variable transconductance current mirror circuit includes a first field effect transistor having a gate, a source, and a drain, and a second field effect transistor having a gate, a source, and a drain. The gate of the second transistor is coupled to the gate of the first transistor, and a current source is coupled to the gates of the first and second transistors. The circuit also includes a voltage supply coupled to the sources of the first and second transistors. The circuit further includes a first diode having an anode and a cathode. The anode of the first diode is coupled to the gates of the first and second transistors, and the cathode of the first diode is coupled to the source of the first and second transistors. The first diode comprises a zener diode having a reverse breakdown voltage operable to prevent gate oxide breakdown of the first and second transistors. The circuit may also include a second diode having an anode coupled to the drain of the first transistor, and a cathode coupled to the gates of the first and second transistors. The second diode is operable to vary the transconductance of the first and second transistors in response to changes in the current supplied to the drain of the first transistor.

20 Claims, 1 Drawing Sheet

VARIABLE TRANSCONDUCTANCE CURRENT MIRROR CIRCUIT

This application claims priority under 35 USC §119 (e) (1) of Provisional Application No. 60/148,852, filed Aug. 12, 1999.

TECHNICAL FIELD OF THE INVENTION

This invention relates in general to the field of integrated electronic devices, and more particularly, to a variable transconductance current mirror circuit.

BACKGROUND OF THE INVENTION

Current mirrors are generally used to provide an output current in proportion to an input current. For example, one type of current mirror may include an input P-channel field effect transistor and an output P-channel field effect transistor. The input current may be applied to a commonly connected gate and drain of the input transistor, which has its source connected to a voltage supply. The gates of the input and output transistors may be connected in common, and the source of the output transistor may also be connected to a voltage supply. The drain of the output transistor may be connected to provide the output current to a load device or other circuit. The input and output transistors may be sized to provide the output current a desired fraction greater than or less than the input current.

Prior art current mirror circuits, however, suffer several disadvantages. For example, prior art current mirror circuits are generally susceptible to breakdown of the gate oxide integrity of the input and output transistors. For example, the voltage signal to the input and output transistors may be greater than the gate oxide integrity of the input and output transistors. Where the gate and the drain of the input transistor are connected together, a source-to-gate voltage drop across the input and output transistors may exceed the gate oxide integrity of the input and output transistors. This is often possible due to transient circumstances and fault conditions that must be accounted for in the input signal received by the mirror circuit.

SUMMARY OF THE INVENTION

Accordingly, a need has arisen for an improved current mirror circuit. In accordance with the present invention, a variable transconductance current mirror circuit is provided which substantially eliminates or reduces disadvantages and problems associated with prior art current mirror circuits.

According to an embodiment of the present invention, a variable transconductance current mirror circuit includes a first field effect transistor having a gate, a source, and a drain, and a second field effect transistor having a gate, a source, and a drain. The gate of the second transistor is connected to the gate of the first transistor, and a current source is connected to the gates of the first and second transistors. The circuit also includes a voltage supply connected to the sources of the first and second transistors. The circuit further includes a first diode having an anode and a cathode. The anode of the first diode is connected to the gate of the first and second transistors, and the cathode of the first diode is connected to the source of the first and second transistors. The first diode comprises a zener diode having a reverse breakdown voltage operable to prevent gate oxide breakdown of the first and second transistors.

According to another embodiment of the present invention, a method for mirroring a variable transconductance current includes supplying a first voltage to a gate of a first field effect transistor and a gate of a second field effect transistor. The method includes supplying a second voltage to a source of the first transistor and a source of the second transistor. The method also includes providing a source-to-gate voltage drop across the first and second transistors and providing a source-to-drain voltage drop across the first transistor. The method further includes providing an input current from the first transistor which is to be mirrored to the second transistor and providing an increase in the source-to-gate voltage drop in response to an increase in the source-to-drain voltage drop to provide an increase in input current.

Technical advantages of the present invention include providing a current mirror circuit that prevents breakdown of the gate oxide integrity of the input and output transistors. For example, according to an embodiment of the present invention, the circuit prevents a source-to-gate voltage drop that is higher than the gate oxide integrity of the transistors.

Another technical advantage of the present invention includes providing a current mirror circuit capable of accurately mirroring over an expanded range of currents. For example, according to an embodiment of the present invention, the circuit provides variable transconductance of the input transistor as the source-to-drain voltage drop and the source-to-gate voltage drop across the input transistor varies.

Other technical advantages will be readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Figure 1:
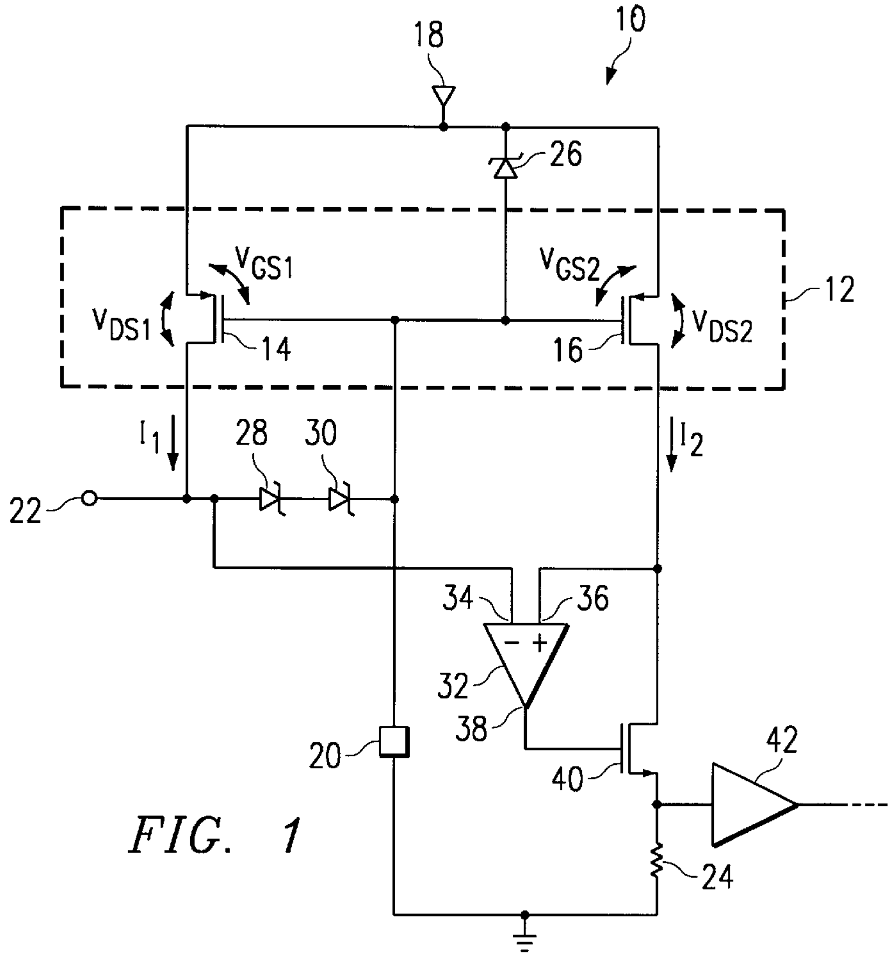
FIG. 1 is a schematic diagram of a variable transconductance current mirror circuit in accordance with an embodiment of the present invention.
Figure 2:
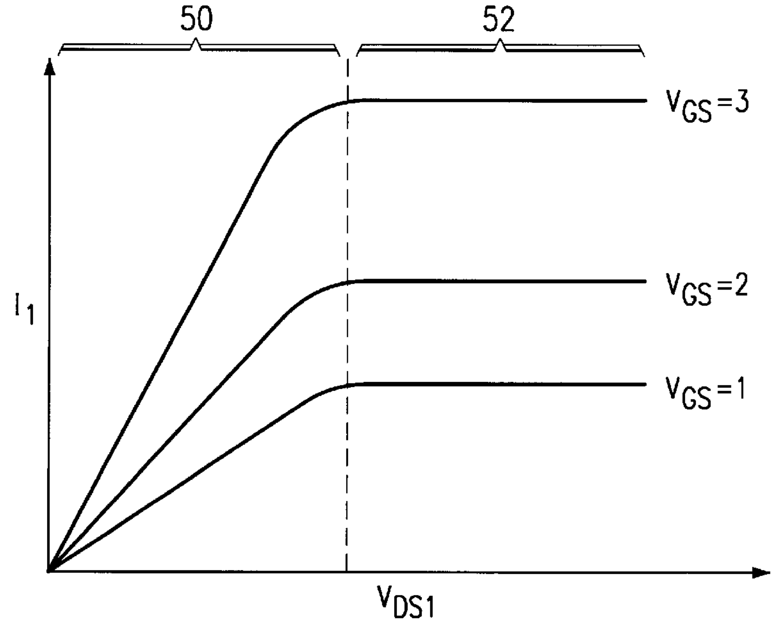
FIG. 2 is a graph illustrating the characteristics of a variable transconductance current mirror circuit in accordance with an embodiment of the present invention.

Embodiments of the present invention and its advantages are best understood by referring to FIGS. 1 and 2 of the drawings, like numerals being used for like and corresponding parts of the various drawings.

FIG. 1 illustrates a schematic diagram of a variable transconductance current mirror circuit 10 constructed in accordance with an embodiment of the present invention. Circuit 10 includes a current mirror 12 comprising a transistor 14 and a transistor 16. Transistors 14 and 16 may comprise P-channel field effect transistors each having a source, a gate, and a drain. In the embodiment illustrated in FIG. 1, transistor 14 serves as an input device having its source connected to a voltage supply 18 and commonly connected to the source of transistor 16.

The gates of transistors 14 and 16 are commonly connected and connected to a current source circuit 20 which is also connected to a ground potential. Current source circuit 20 may include additional circuitry contained on the same integrated circuit as circuit 10 or may include circuitry contained on another integrated circuit that generates current. In general, circuit 10 receives an input current $I_1$ at an input node 22 that may be connected to another circuit and provides a mirrored and, if desired, ratioed output current $I_2$ to a load device 24. For example, the drain of transistor 16 may be connected to provide output current $I_2$ to load device 24.

Circuit 10 also comprises a zener diode 26. The anode of diode 26 is connected to the gates of transistors 14 and 16 and the cathode of diode 26 is connected to voltage supply 18. In operation, diode 26 clamps a voltage level at the gates of transistors 14 and 16 at a predetermined level below voltage supply 18. For example, diode 26 may be sized to have a 6.5 reverse breakdown voltage, thereby clamping the gate voltage level of transistors 14 and 16 at a maximum of 6.5 volts below voltage supply 18. Therefore, diode 26 may be sized to limit the maximum source-to-gate voltage drop $V_{GS1}$ and $V_{GS2}$ of transistors 14 and 16, respectively.

Circuit 10 also comprises zener diodes 28 and 30. Diodes 28 and 30 are connected in series having an anode of diode 28 connected to the drain of transistor 14 and a cathode of diode 30 connected to the gates of transistors 14 and 16. Zener diodes 28 and 30 operate to clamp a voltage level at the gate of transistors 14 and 16 at a predetermined level below a voltage level at the drain of transistor 14. For example, diodes 28 and 30 may each induce a 0.7 voltage drop, thereby clamping a voltage level at the gates of transistors 14 and 16 at 1.4 volts below a voltage level at the drain of transistor 14. Diodes 28 and 30 may be replaced by a single diode or additional diodes may be connected in series to diodes 28 and 30 to provide various clamping voltage levels at the gate of transistors 14 and 16.

Diodes 28 and 30 also include reverse breakdown voltage levels to protect diodes 26, 28 and 30 in a fault condition. For example, diodes 28 and 30 may be sized to have a reverse breakdown voltage in combination with the reverse breakdown voltage of diode 26 to exceed a maximum voltage level provided by voltage supply 18. Thus, should input node 22 become grounded due to an input signal transient or fault condition, the total reverse breakdown of diodes 26, 28 and 30 exceeds the maximum voltage level that may be provided by voltage supply 18.

Circuit 10 also includes a differential amplifier 32. Differential amplifier 32 includes a negative input 34 connected to the anode of diode 28 and the drain of transistor 14, a positive input 36 connected to the drain of transistor 16, and an output 38 connected to the gate of an N-channel field effect transistor 40. Differential amplifier 32 operates to provide a virtual short between the drain of transistor 14 and the drain of transistor 16 to regulate the voltage level at the drain of transistor 16 in response to a voltage level at the drain of transistor 14. Thus, amplifier 32 regulates the voltage level at the drain of transistor 16 to be equal to the voltage level at the drain of transistor 14.

The drain of transistor 40 is connected to the drain of transistor 16 and the source of transistor 40 is connected to load device 24 to prevent interference between voltage levels regulated by amplifier 32 and a voltage level drop across load device 24. For example, amplifier 32 operates to regulate the voltage levels at the drains of transistors 14 and 16 to be equal. However, load device 24 also experiences a voltage drop. Thus, transistor 40 operates to drop the difference in voltage between load device 24 and the drain of transistor 16. Thus, output current $I_2$ may be provided to load device 24, and the voltage drop across load device 24 may be provided to a comparator network 42 as a reference voltage or may be provided to other suitable devices or circuits.

In operation, input node 22 may be connected to another circuit or various circuits such that accurate mirroring of a large range of input currents $I_1$ may be required. In an automotive application, for example, input node 22 may be connected to a sensor that is connected to a wheel of an automobile. However, sensors supplied by various manufacturers may pull varying input currents $I_1$. Circuit 10 provides accurate mirroring over the expanded range of input currents $I_1$.

As illustrated in FIG. 1, diodes 28 and 30 located between the drain and the gate of transistor 14 provide a varying transconductance of transistor 14 as the source-to-drain voltage drop $V_{DS1}$ across transistor 14 varies. For example, $V_{DS1}$ increases as additional input current $I_1$ is pulled out of transistor 14. In response to an increase in $V_{DS1}$ the source-to-gate voltage drop $V_{GS1}$ across transistor 14 also increases until diode 26 clamps the $V_{GS1}$ to the diode 26 clamping voltage. Thus, the additional $V_{GS1}$ voltage drop across transistor 14 causes the transconductance of transistor 14 to increase. At lower input currents $I_1$, the source-to-gate voltage drop $V_{GS1}$ across transistor 14 is smaller, thereby providing less transconductance in transistor 14. Therefore, the transconductance of transistor 14 is variable such that the transconductance of transistor 14 increases as the input current $I_1$ increases.

FIG. 2 is a graph illustrating the characteristics of circuit 10 as a function of input current $I_1$ and source-to-drain voltage drop $V_{DS1}$ for various source-to-gate voltage drop values $V_{GS1}$. As illustrated in FIG. 2, current mirroring occurs while transistor 14 is operating in the linear region indicated generally at 50. For example, if $V_{GS1}$ remains fixed at a voltage drop equal to one volt, an increase in the source-to-drain voltage drop $V_{DS1}$ causes operation in a saturation region indicated by reference numeral 52 before reaching the higher input current $I_1$ levels desired. If $V_{GS1}$ remains fixed at a voltage drop equal to three volts, the $V_{DS1}$ and $V_{DS2}$ voltage drop on transistors 14 and 16, respectively, is small for small amounts of current, thereby causing any small amount of absolute error in regulating $V_{DS2}$ to match $V_{DS1}$ to translate into a large percent error.

As illustrated in FIG. 2, for a given input current $I_1$ with a $V_{GS1}$ of one volt provides a $V_{DS1}$ voltage drop greater than the $V_{DS1}$ voltage drop provided by the same input current $I_1$ with a $V_{GS1}$ of three volts, thereby causing any small amount of absolute error in regulating $V_{DS2}$ to match $V_{DS1}$ to translate into a lesser percent error when $V_{GS1}$ equals one volt than when $V_{GS1}$ equals three volts. In accordance with the present invention, as the source-to-drain voltage drop $V_{DS1}$ increases, the source-to-gate voltage drop $V_{GS1}$ also increases, thereby increasing the amount of input current $I_1$ that can be provided from transistor 14 in the linear operating region.

Circuit 10 also provides increased system integrity by protecting the gate oxide integrity of transistors 14 and 16. For example, voltage supply 18 may provide voltage levels exceeding the gate oxide integrity of transistors 14 and 16. In an automobile application, for example, under a double battery condition, a thirty-two volt voltage supply may be provided. Further, for example, during load dump conditions of an automobile electrical system, a discharge across the automobile electrical system may be equal to forty volts. The gate oxide integrity of transistors 14 and 16 may be substantially less than the maximum supply voltage that may be provided at voltage supply 18. Thus, at higher voltage supply 18 levels, the potential arises for a source-to-gate voltage drop exceeding the gate oxide integrity of transistors 14 and 16.

In accordance with the present invention, as illustrated in FIG. 1, diode 26 may be sized to have a reverse breakdown voltage to provide an upper limit to the source-to-gate voltage drop $V_{GS1}$ and $V_{GS2}$. Thus, circuit 10 provides greater circuit integrity than prior current mirror circuits by protecting the gate oxide integrity of current mirror circuit transistors at higher voltage supply levels.

Although the present invention has been described in detail, it should be understood that various changes, substitutions, and alterations may be made without departing from the spirit and scope of the present invention as defined by the appended claims.

What is claimed is:

1. A variable transconductance current mirror circuit comprising:

a first field effect transistor having a gate, a source, and a drain;

a second field effect transistor having a gate, a source, and a drain, the gate of the second transistor coupled to the gate of the first transistor;

a current source coupled to the gates of the first and second transistors;

a voltage supply coupled to the sources of the first and second transistors; and a first diode having an anode and a cathode, the anode of the first diode coupled to the gates of the first and second transistors, the cathode of the first diode coupled to the source of the first and second transistors, the first diode comprising a zener diode having a reverse breakdown voltage operable to prevent oxide breakdown of the first and second transistors.

2. The circuit of claim 1, further comprising a differential amplifier coupled to the first and second transistors, the amplifier operable to regulate a voltage drop between the source and the drain of the first and second transistors.

3. The circuit of claim 2, wherein the amplifier comprises a positive input, a negative input, and an output, the negative input coupled to the drain of the first transistor, the positive input coupled to the drain of the second transistor, the amplifier operable to regulate a voltage level at the drain of the second transistor in response to a voltage level at the drain of the first transistor.

4. The circuit of claim 1, further comprising a second diode coupled to the first and second transistors, the second diode operable to limit a voltage level at the gate of the first and second transistors at a predetermined level below a voltage level at the drain of the first transistor.

5. The circuit of claim 4, wherein the second diode comprises an anode and a cathode, the anode of the second diode coupled to the drain of the first transistor, the cathode of the second diode coupled to the gate of the first and second transistors.

6. The circuit of claim 1, further comprising an N-channel field effect transistor coupled to the drain of the second field effect transistor, the N-channel transistor operable to provide a voltage drop between a regulated voltage level at the drain of the second transistor and a voltage drop across a load device.

7. The circuit of claim 6, wherein the N-channel transistor comprises a gate coupled to an output of a differential amplifier, the differential amplifier operable to regulate the voltage level at the drain of the second transistor in response to a voltage level at the drain of the first transistor.

8. A variable transconductance current mirror circuit comprising a first field effect transistor having a gate, a drain, and a source;

a second field effect transistor having a gate, a drain, and a source, the gate of the second transistor coupled to the gate of the first transistor;

a current source coupled to the gates of the first and second transistors;

a first diode coupled to the gates of the first and second transistors operable to limit a voltage drop between the source and the gate of the first and second transistors; and a second diode having an anode and a cathode, the cathode coupled to the gates of the first and second transistors, the anode coupled to the drain of the first transistor, the second diode operable to vary the voltage drop between the source and the gate of the first and second transistors in response to an increase in a voltage drop between the source and the drain of the first transistor.

9. The circuit of claim 8, further comprising a differential amplifier coupled to the first and second transistors, the amplifier operable to regulate a voltage drop between the source and the drain of the first and second transistors.

10. The circuit of claim 9, wherein the amplifier comprises a positive input, a negative input, and an output, the negative input coupled to the drain of the first transistor, the positive output coupled to the drain of the second transistor, the amplifier operable to regulate a voltage level at the drain of the second transistor in response to a voltage level at the drain of the first transistor.

11. The circuit of claim 8, further comprising an N-channel field effect transistor coupled to the drain of the second field effect transistor, the N-channel transistor operable to provide a voltage drop between a regulated voltage level at the drain of the second transistor and a voltage drop across a load device.

12. The circuit of claim 11, wherein the N-channel transistor comprises a gate coupled to an output of a differential amplifier, the differential amplifier operable to regulate the voltage level at the drain of the second transistor in response to a voltage level at the drain of the first transistor.

13. The circuit of claim 8, wherein the first diode comprises a zener diode having a reverse breakdown voltage operable to prevent oxide breakdown of the first and second transistors.

14. The circuit of claim 8, wherein the first diode comprises a zener diode.

15. A method for mirroring a variable transconductance current comprising:

supplying a source current to a drain of a first field effect transistor, the first field effect transistor comprising a gate coupled to a gate of a second field effect transistor;

supplying a voltage to a source of the first transistor and a source of the second transistor;

providing an input current from the first transistor which is to be mirrored through the second transistor; and providing a source-to-drain voltage drop greater than a source-to-gate voltage drop through the first transistor to prevent oxide breakdown of the first and second transistors.

16. The method of claim 15, wherein providing a source-to-drain voltage drop comprises providing a zener diode having an anode coupled to the gate of the first and second transistors, the zener diode having a reverse breakdown voltage operable to limit the source-to-gate voltage drop across the first and second transistors.

17. The circuit of claim 15, further comprising regulating a drain voltage level of the second transistor in response to a drain voltage level of the first transistor.

18. The circuit of claim 17, wherein regulating comprises supplying a virtual short between the drains of the first and second transistors via a differential amplifier.

19. A method for mirroring a current using variable transconductance, comprising:

supplying a first voltage to a gate of a first field effect transistor and a gate of a second field effect transistor;

supplying a second voltage to a source of the first transistor and a source of the second transistor;

providing a source-to-gate voltage drop across the first and second transistors;

providing a source-to-drain voltage drop across the first transistor;

providing an input current from the first transistor which is to be mirrored through the second transistor; and providing an increase in the source-to-gate voltage drop in response to an increase in the source-to-drain voltage drop to provide an increase in input current.

20. The circuit of claim 19, wherein providing an increase in the source-to-gate voltage drop comprises providing at least one diode having an anode coupled to the drain of the first transistor and a cathode coupled to the gates of the first and second transistors.

* * * * *